United States Patent
Haas et al.

(10) Patent No.: US 11,653,522 B2
(45) Date of Patent: May 16, 2023

(54) ELECTROLUMINESCENT DEVICE WITH IMPROVED RESOLUTION AND RELIABILITY

(71) Applicant: MICROOLED, Grenoble (FR)

(72) Inventors: Gunther Haas, Saint-Egreve (DE); Sébastien Guillamet, Saint-Jacques-de-la-Lande (FR); Michael Thomschke, Saint-Egreve (DE); Robin Bonnet, Grenoble (FR)

(73) Assignee: MICROOLED, Grenoble (FR)

(*) Notice: Subject to any disclaimer, the term of this patent is extended or adjusted under 35 U.S.C. 154(b) by 223 days.

(21) Appl. No.: 17/045,194

(22) PCT Filed: Apr. 4, 2019

(86) PCT No.: PCT/FR2019/050791
§ 371 (c)(1),
(2) Date: Oct. 5, 2020

(87) PCT Pub. No.: WO2019/193290
PCT Pub. Date: Oct. 10, 2019

(65) Prior Publication Data
US 2021/0151714 A1 May 20, 2021

(30) Foreign Application Priority Data
Apr. 5, 2018 (FR) ...................................... 1852948

(51) Int. Cl.
*H01L 27/32* (2006.01)
*H01L 51/52* (2006.01)
*H01L 51/56* (2006.01)

(52) U.S. Cl.
CPC ........ *H01L 51/5253* (2013.01); *H01L 27/322* (2013.01); *H01L 27/326* (2013.01); *H01L 51/5278* (2013.01); *H01L 51/56* (2013.01)

(58) Field of Classification Search
CPC ............. H01L 27/3211; H01L 27/3213; H01L 27/322; H01L 27/326; H01L 27/3246
(Continued)

(56) References Cited

U.S. PATENT DOCUMENTS

| 5,284,974 | A | 2/1994 | Williams |
| 8,063,398 | B2 | 11/2011 | Toerker |

(Continued)

FOREIGN PATENT DOCUMENTS

| CN | 105847873 A | 8/2016 |
| CN | 106783924 A | 5/2017 |

(Continued)

OTHER PUBLICATIONS

French Search Report dated Dec. 6, 2018 issued in French Application No. 1852948.
(Continued)

*Primary Examiner* — Hoai V Pham
(74) *Attorney, Agent, or Firm* — Gearhart Law, LLC; David Postolski

(57) ABSTRACT

Disclosed is an electroluminescent display device (100) comprising a plurality of pixels (120) disposed on a substrate (110), each pixel being formed by one or more basic emitting zones (121*a, b, c*), every basic emitting zone having a base electrode (102*a, b, c*) disposed on said substrate (110) and an OLED stack (105) comprising an electroluminescent layer disposed on said base electrode (102*a, b, c*), the device (100) further comprising a common electrode (107) disposed on top of the OLED stack, said device being characterized in that: —two adjacent base electrodes (102*a*, 102*b*) belonging to two adjacent basic emitting zones (121*a, b*) are separated by a filler element having an insulating surface (103) which fills the zone (111) between said adjacent base electrodes (102*a*, 102*b*) and electrically insulates them from
(Continued)

each other; at least the surface of said filler element having an insulating surface (103) in contact with the base electrodes (102*a*, 102*b*) is made of an insulating material; a separator (104) is situated above the filler element (103) and separates the electroluminescent layers of the OLED stack (105) from two adjacent basic emitting zones (121*a*, *b*).

40 Claims, 6 Drawing Sheets

(58) Field of Classification Search
USPC .................................................. 257/40, 59
See application file for complete search history.

(56) References Cited

U.S. PATENT DOCUMENTS

| 8,063,551 | B1 | 11/2011 | Stainer |
| 8,564,084 | B2 | 10/2013 | Vogtmeier |
| 9,111,882 | B1 | 8/2015 | Chen |
| 9,373,668 | B2 | 6/2016 | Kim |
| 9,419,245 | B2 | 8/2016 | Kamiya |
| 9,455,324 | B2 | 9/2016 | Cao |
| 9,536,933 | B2 | 1/2017 | Sato |
| 9,647,026 | B2 | 5/2017 | Ebiko |
| 2010/0156286 | A1 | 6/2010 | Bae |
| 2014/0103385 | A1 | 4/2014 | Hatano |
| 2014/0159184 | A1 | 6/2014 | Lim |
| 2015/0060822 | A1 | 3/2015 | Kamiya |
| 2015/0280170 | A1 | 10/2015 | Mohan |
| 2016/0155785 | A1 | 6/2016 | Sato |
| 2016/0181331 | A1 | 6/2016 | Li |
| 2019/0198590 | A1* | 6/2019 | Kim .................... H01L 27/3246 |

FOREIGN PATENT DOCUMENTS

| CN | 107346778 A | 11/2017 |
| EP | 2927985 A2 | 10/2015 |
| EP | 3301548 A1 | 4/2018 |
| TW | 283141 B | 8/1996 |
| WO | 2017021372 A1 | 2/2017 |

OTHER PUBLICATIONS

International Search Report dated Aug. 5, 2019 issued in PCT/FR2019/050791.
D. Braun, Synthetic Metals 92, "Crosstalk in Passive Matrix Polymer LED Displays", 1998 (p. 107-113).

* cited by examiner

ELECTROLUMINESCENT DEVICE WITH IMPROVED RESOLUTION AND RELIABILITY

CROSS REFERENCE TO RELATED APPLICATION

This application is a national stage application of PCT-application number PCT/FR2019/050791 filed on Apr. 4, 2019, which claims priority of French patent application No. 1852948 filed on Apr. 5, 2018, both of which disclosures are incorporated herein by reference.

TECHNICAL FIELD OF THE INVENTION

The invention relates to the field of optoelectronic devices and components, and more precisely to the electroluminescent devices of the OLED (organic light-emitting diode) type. It relates more particularly to improving the reliability of the display color range as well as of the resolution of a display screen of the OLED type. It relates both to simple OLED devices and to OLED devices of the tandem type.

PRIOR ART

Organic electroluminescent devices give rise to considerable interest in flat-screen and thin-screen lighting devices. The operational life of OLED devices decreases as the current density or the luminance increases since the large number of holes and electrons passing through the organic layer causes electrochemical secondary reactions of the organic components. One particular approach for solving this problem is the use of two or more superimposed OLED diodes (so-called tandem devices), which aims to achieve a longer operating life under high luminance. In a tandem OLED structure, a plurality of electroluminescent units are stacked in series through interconnection layers such as a transparent conductive layer (TCL) or a charge generation layer (CGL). In addition, the electron injection layers (EILs) also play an important role in reducing the electron injection barrier of the TCL or CGL in the first electroluminescent unit. With an identical current density, compared with a single electroluminescent device, tandem OLEDs with two superimposed electroluminescent units can exhibit double luminance. Consequently the efficacy and operational life of tandem OLEDs can be improved compared with those of conventional OLEDs with a single unit.

OLED display screens generally comprise a matrix structure of individual pixels, which is controlled by a grid of vertical and horizontal conductive tracks; this structure can allow individual addressing of the pixels. This is illustrated schematically in FIG. 1, which will be explained below. In color screens each pixel is subdivided into sub-pixels of various colors (typically three or four, including red, green and blue), which cooperate in order to emit a light spot (pixel) of the required color. FIG. 3(a) shows a cross section of such a screen. On top of the electrodes of the sub-pixels an OLED stack is deposited, which covers the entire surface of the matrix and which, in this example, emits white light. The RGB (red-green-blue) or RGBW (red-green-blue-white) primaries of the sub-pixels are in this case generated by colored filters situated above the OLED stack. Another way of producing the primary colors is to structure the OLED layers in sub-pixels with different emission colors. As the method of structuring the OLED layers is fairly complex and the achievable resolution very limited, it is even preferred in this case to keep a maximum of common layers (i.e. layers covering the entire surface of the matrix), in general the layers transporting the charge carriers, and to structure only the emitting layers. However, in the above two cases, it is observed that the adjoining pixels or sub-pixels may interact, by capacitive coupling or by stray currents passing in particular through the common conductive layers of the OLED stack.

One example for this stray current is illustrated in FIG. 3(b), which will be explained below. This undesirable interaction between adjacent pixels is known to persons skilled in the art by the term crosstalk; it leads especially to undesirable modification of the colors in the case of color screens. The theoretical aspects of the crosstalk phenomenon in OLED devices have been studied for a long time (see for example the publication by D. Braun "Crosstalk in passive matrix polymer LED displays" which appeared in 1998 in the journal Synthetic Metals 92, p. 107-113).

Well known in the case of single-diode OLED devices, the crosstalk phenomenon is exacerbated in OLED devices with tandem diodes. The interconnection layers of the superimposed structures in tandem have fairly high electrical conductivity, and stray currents are observed in the plane of the layers. This problem becomes more perceptible when the size of the sub-pixel decreases. Apart from the digital correction of the consequences of the crosstalk (which amounts to accepting the crosstalk phenomenon and reducing its impact on the image), various approaches for combating crosstalk at source are known, that is to say for reducing the physical phenomenon at the pixel or sub-pixel level.

For a simple OLED device, separating each pixel in order to isolate them from one another is known, in order to prevent the problems of short-circuit related to moisture in the encapsulation layers. The document EP 2 927 985 describes a structure wherein each pixel is hermetically sealed and isolated from its adjacent pixels. Manufacturing such a structure requires numerous and complex method steps. Delimiting the pixel zones by supplementary separating elements, such as walls, is also known, as described in the document U.S. Pat. No. 9,419,245. These methods are complex and give rise to significant extra cost.

Having regard to the above, one objective of the present invention is to at least partially remedy the drawbacks of the prior art mentioned above and to propose an architecture for an OLED display device that makes it possible to significantly reduce lateral stray currents, even for pixels of very small size (typically less than 5 µm), for structures with a very small inter-pixel space, or for displays with tandem diodes.

Another objective of the invention is to propose a method that makes it possible to limit stray currents between the pixels for a miniature electroluminescent device.

OBJECT OF THE INVENTION

The invention applies to an electroluminescent display device comprising a plurality of pixels deposited on a substrate, each pixel being formed by one or more basic emitting zones, wherein each basic emitting zone includes a base electrode deposited on said substrate and an electroluminescent layer deposited on said base electrode, and said device comprising a common electrode deposited above said electroluminescent layer.

According to a first feature of the invention, two adjacent base electrodes belonging to two adjacent basic emitting zones are separated by a filler element with an insulating surface that fills the zone between said adjacent base electrodes and which insulates them electrically from each other.

At least the surface of said filler element with an insulating surface that is in contact with said base electrodes is produced from an insulating material; the whole of said filler element with an insulating surface can be produced from insulating material.

According to another feature of the invention, said filler element projects with its insulating material over part of the surface of said base electrodes.

According to yet another feature of the invention, a separator is situated above said filler element and separates the electroluminescent layers of two adjacent basic emitting zones; this eliminates the leakage currents that propagate horizontally to the substrate in the electroluminescent layers.

Part of said common electrode is deposited by a conformal deposition technique, preferably by ALD (atomic layer deposition).

Thus a first object of the present invention is an electroluminescent display device comprising a plurality of pixels deposited on a substrate, each pixel being formed by one or more basic emitting zones, each basic emitting zone including a base electrode deposited on said substrate and an OLED stack comprising an electroluminescent layer deposited on said base electrode. Said electroluminescent display device comprises a common electrode deposited above said OLED stack. It is characterized in that:
  two adjacent base electrodes belonging to two adjacent basic emitting zones are separated by a filler element with an insulating surface that fills the zone between said adjacent base electrodes and which insulates them electrically from each other,
  at least the surface of said filler element with an insulating surface that is in contact with said base electrodes is produced from an insulating material;
  a separator is situated above said filler element and separates the electroluminescent layers of the OLED stack of two adjacent basic emitting zones.

Said common electrode is advantageously deposited by a conformal deposition technique, preferably by ALD (atomic layer deposition) or CVD (chemical vapor deposition) in order to obtain continuity through the separators. The layers of the OLED stack are advantageously deposited by a directive (i.e. non-conformal) deposition technique, such as thermal evaporation, in order to be able to separate them by means of the separator.

Advantageously, said filler element projects with its insulating material over part of the surface of said base electrodes.

In one embodiment, between two adjacent separators, and delimited by them, a top electrode extends, deposited between said OLED stack and said common electrode. This top electrode does not have any functional advantage; on the contrary, in the case of a device of the upward emission type, it absorbs light. It may be useful for protecting the OLED stack during deposition of the common electrode.

In an advantageous embodiment, this top electrode is absent, and it is the common electrode that fulfils the function of electrode for each basic emitting zone, that is to say the cathode function for a top-emission device or an anode for an inverse device.

In one embodiment, between two adjacent separators, and delimited by the latter, a charge-carrier injection layer extends, deposited between said OLED stack and said common electrode. This charge-carrier injection layer is capable of injecting charge carriers into the OLED stack (electrons in the case of a so-called standard OLED device, or holes in the case of a so-called inverse OLED device, these terms "standard" and "inverse" being defined below), and is capable of protecting the OLED stack when the common electrode is deposited. This charge-carrier injection layer may in particular be made from molybdenum oxide or tungsten oxide, with a preferred thickness of between 0.5 nm and 5 nm.

We state here that a person skilled in the art calls an OLED device "standard" in which the injection of the holes is done on the near face of the substrate and the injection of the electrodes on the face opposite to the substrate, whereas in a so-called "inverse" device it is the electrons that are injected on the near face of the substrate, and holes on the face opposite to the substrate.

In another embodiment said filler element with an insulating surface and said separator constitute a barrier element that extends upwards from the substrate. Said separator can fill a top part of the zone between said adjacent base electrodes.

In yet another embodiment, the entire filler element with insulating surface is produced from an insulating material. Said separator may comprise said common electrode.

These embodiments may be combined with each other.

In all these embodiments the display device may comprise an encapsulation system deposited on top of the common electrode. Said encapsulation system may comprise a layer of polymer and an inorganic layer, preferably an oxide. It may comprise an inorganic layer, preferably an oxide, deposited between the common electrode and the layer of polymer. It may comprise a smoothing layer deposited either on top of said common electrode or on top of said encapsulation system.

Said OLED display device according to the invention may comprise a system of colored filters, deposited on the common electrode, or preferably on the encapsulation system, or even more preferentially on said smoothing layer.

The display device according to the invention may comprise two superimposed OLED stacks, which are then typically separated by a charge-generation layer.

Another object of the present invention is an electroluminescent display device comprising a plurality of pixels deposited on a substrate, each pixel being formed by one or more basic emitting zones, each basic emitting zone including a base electrode deposited on said substrate and an OLED stack comprising an electroluminescent layer deposited on said base electrode. Said electroluminescent display device comprises a common electrode deposited on top of said OLED stack. It is characterized in that:
  two adjacent base electrodes belonging to two adjacent basic emitting zones are separated by a filler element with an insulating surface that fills the zone between said adjacent base electrodes and which insulates them electrically from each other,
  at least the surface of said filler element with insulating surface that is in contact with said base electrodes is produced from an insulating material,
  a separator is situated above said filler element, separates the electroluminescent layers of the OLED stack of two adjacent basic emitting zones, and fills a top part of the zone between said adjacent base electrodes.

Said filler element with insulating surface typically comprises an insulation layer in contact with the adjacent base electrodes, capable of insulating them electrically from each other; it may comprise other functional layers, such as the common electrode. The separator, which extends in the natural space (which is typically in the form of a trench) between two adjacent basic emitting zones, typically comprises the smoothing layer (planarization layer) deposited on top of the common electrode; if this smoothing layer is absent, it may comprise an empty space (i.e. air).

These embodiments may be combined with each other.

Said common electrode is advantageously deposited by a conformal deposition technique, preferably by ALD or CVD. Advantageously, said filler element projects with its insulating material over part of the surface of said base electrodes. The layers of the OLED stack are deposited by a directive deposition technique, for example by thermal evaporation.

In one embodiment, between two adjacent separators, and delimited by the latter, a top electrode extends, deposited between said OLED stack and said common electrode. It may be useful for protecting the OLED stack during the deposition of the common electrode. It may be absent, and it is the common electrode that fulfils the function of electrode for each basic emitting zone, that is to say the function of cathode for a standard device or of anode for an inverse device.

In a variant of this embodiment, between two adjacent separators, and delimited by the latter, a charge-carrier injection layer extends, deposited between said OLED stack and said common electrode. This charge-carrier injection layer is capable of injecting charge carriers into the OLED stack (electrons in the case of an OLED device of the top emission type, or holes in the case of a so-called inverse OLED device), and is capable of protecting the OLED stack when the common electrode is deposited. This charge-carrier injection layer may in particular be made from molybdenum oxide or tungsten oxide, with a preferred thickness of between 0.5 nm and 5 nm.

In all these embodiments the display device may comprise an encapsulation system deposited on top of the common electrode. Said encapsulation system may comprise a polymer layer and an inorganic layer, preferably an oxide. It may comprise an inorganic layer, preferably an oxide, deposited between the common electrode and the polymer layer. It may comprise a smoothing layer deposited either on top of said common electrode or on top of said encapsulation system.

Said OLED display device according to the invention may comprise a system of colored filters, deposited on the common electrode, or preferably on the encapsulation system, or even more preferentially on said smoothing layer.

The display device according to the invention may comprise two superimposed OLED stacks, which are then typically separated by a charge-generation layer.

DESCRIPTION OF THE FIGURES

FIG. 1 shows the electrical diagram of a matrix screen of the OLED type of a known type.

FIG. 2 shows three known examples of arrangement of sub-pixels with different colors for forming a pixel capable of displaying the required color.

FIG. 3 shows schematically a perpendicular cross section of a pixel in an OLED display according to the prior art with an OLED with white emission and color filters. FIG. 3(*a*) shows several pixels; FIG. 3(*b*) shows a single pixel with three sub-pixels. FIG. 3(*c*) shows an embodiment of the color pixel without color filters.

FIG. 4 is a view in cross section illustrating a device according to one of the embodiments of the invention.

FIG. 5 is a view in cross section illustrating a structure device according to another embodiment of the invention.

FIG. 6 shows schematically a perpendicular cross section of a device of the tandem type according to the invention; FIG. 6(*b*) shows schematically a detail of FIG. 6(*a*), namely the stack of organic layers forming the OLED layer. FIG. 6(*c*) shows a variant, FIG. 6(*d*) shows schematically the stack of OLED layers on top of the separator in this variant.

FIGS. 7 and 8 show variants of the devices shown respectively in FIGS. 4 and 5.

The following numerical references are used in the present description:

| | | | |
|---|---|---|---|
| 10 | OLED display (of known type) | 12 | Matrix of pixels |
| 14 | OLED diode | 16 | Control circuit of 12 |
| 18 | Field-effect transistor | 20 | Field-effect transistor |
| 22 | Capacitor | 30 | Control circuit for rows |
| 32 | Video control circuit | 36 | Control unit |
| 34 | Power supply circuit for columns | 38 | Conductive track for rows |
| | | 40 | Conductive track (video signal) |
| 42 | Conductive track for columns | 50 | Pixel |
| 51 | Red sub-pixel | 52 | Blue sub-pixel |
| 53 | Green sub-pixel | 54 | White sub-pixel |
| 70 | OLED display (of known type) | 71 | Substrate |
| 75 | Filler element (gap fill) | 72, 73, 74 | Sub-pixel control electrode |
| 76 | OLED layers | | |
| 77 | Encapsulation layer | 80 | Electroluminescent layer of 76 |
| 81, 82 | Charge injection and transport layer | 83 | Charge injection and transport layer |
| 84 | Charge injection and transport layer | 85 | Electrode |
| | | 90 | Pixel |
| 91 | Blue filter for sub-pixel | 92 | Red filter for sub-pixel |
| 93 | Green filter for sub-pixel | 98 | Electrode for pixel |
| 95, 96, 97 | Red, green, blue electroluminescent layers | 99 | Common electrode |
| 100 | Device according to the invention | 102 | Base electrode for each sub-pixel |
| 103 | Filler element with insulating surface | 104 | Separator |
| | | 105 | OLED stack |
| 107 | Conformal common electrode | 106 | Top injection layer (optional) |
| 109 | Colored filter | 110 | Substrate |
| 108 | Planarization (smoothing) layer | 111 | Natural space (gap) |
| | | 112 | Rim of 103 on 102 |
| 102 | Pixel | 121 | Sub-pixels |
| 130 | Tandem device according to the invention | 131 | First OLED stack |
| | | 133 | Second OLED stack |
| 132 | Charge-generation layer | 1311, 1331 | Electron injection and transport layer of 131 or 133 |
| 1312, 1332 | Electroluminescent (or emitting) layer of 131 or 133 | 1313, 1333 | Hole injection and transport layer of 131 or 133 |
| 140 | Stack on separator 104 | 141, 143 | First and second stacks on separator 104 |

-continued

| 200 | Device according to the invention | 201 | Sub-pixels |
| --- | --- | --- | --- |
| 202 | Sub-pixel control electrode | 203 | Filler element with insulating surface |
| 204 | Separator | 205 | OLED stack |
| 206 | Top injection layer (optional) | 207 | Conformal common electrode |
|  |  | 209 | Colored filter |
| 208 | Smoothing layer | 211 | Natural space (gap) between electrodes 202 |
| 210 | Substrate |  |  |
| 212 | Rim of 203 on 202 | 213 | Pixel |
| 221 | Layer of polymer | 220 | Encapsulation system |
| 223 | Layer of insulator | 222 | Layer of oxide |

DETAILED DESCRIPTION

Figure 1:
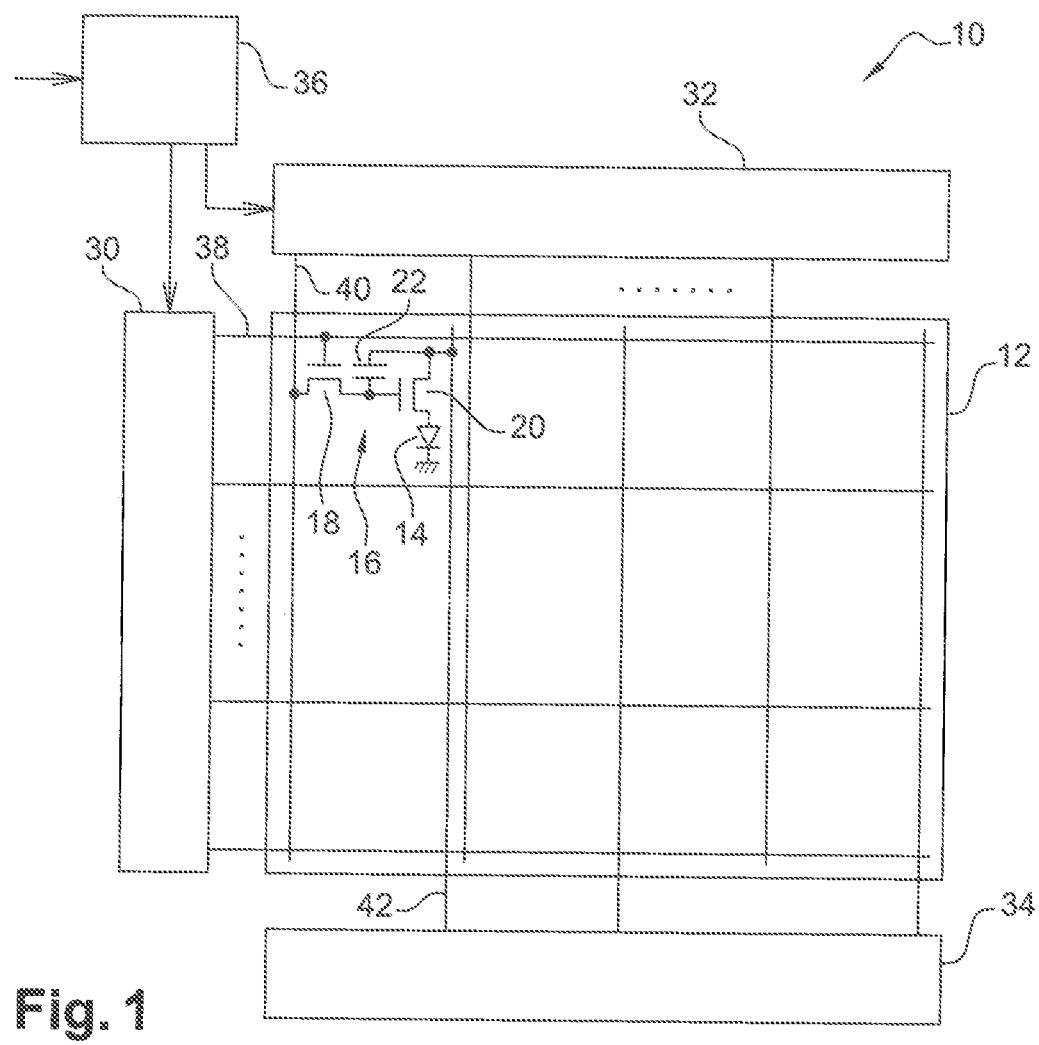
FIGS. 1 to 3 illustrate known general aspects of the OLED devices and displays.

FIG. 1 shows schematically the circuit of an OLED display 10 of a known type that comprises a pixel matrix unit 12 capable of producing an image, and a control unit 36. The OLED diodes 14 and the control circuits 16 thereof are disposed so as to form pixels in the pixel matrix unit 12, said pixel matrix including rows (horizontal) and columns (vertical). Each circuit 16 controlling a pixel 12 comprises a plurality of thin-film transistors 18, 20 (typically in CMOS (complementary metal oxide semiconductor) or TFT (thin-film transistor) technology) and a capacitor 22. The control unit 36 controls a control circuit for the rows 30 and a video addressing circuit 32, as well as an electrical supply circuit 34 for addressing the pixel columns; it provides the addressing of the pixel circuits 36 and controls the light emission of the OLED diodes 14. The control circuit for the rows is connected to the conductive tracks 38 addressing the scanning lines of the pixel matrix. It selects the scanning lines 38 according to a signal coming from the control unit 36, and applies a voltage in order to switch on the TFTs 18 situated on the scanning row 38 selected. The video addressing circuit 32 is connected to conductive tracks 40 addressing the columns of the video signal. The video addressing circuit 32 receives a video signal from the control unit 36 and sends a voltage over the video conductive tracks 40 of the columns on the conductive tracks of the rows selected by the corresponding control circuit 30. This voltage signal is entered into the capacitor 32 through the TFT 18 of the OLED diode 14 of the pixel row selected. The control TFT 20 sends a current corresponding to the voltage recorded at the OLED diode 14, and because of this the OLED diode 14 of the selected row 38 emits light.

The electrical supply circuit 34 is connected to the conductive tracks 42 supplying the pixel columns; it supplies the OLED diodes 14 by means of the conductive tracks 32 and the TFTs 20 of the row of pixels selected.

Figure 2A:
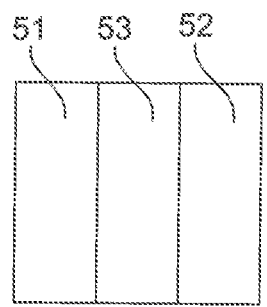
Figure 2B:
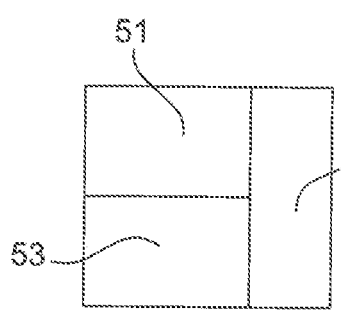

This principle of addressing an OLED diode forming a pixel in a matrix of pixels, known per se, can be applied, also in a way known per se, to the addressing of an OLED diode forming a sub-pixel in a matrix of pixels of a color display device, wherein each pixel comprises a plurality of sub-pixels (usually three or four) with different colors; this will be explained here in relation to FIG. 2. FIGS. 2(a), (b) and (c) show three examples for the geometrical arrangement of these sub-pixels 51, 52, 53, 54 for forming a pixel 50 capable of displaying the required color. In these figures the sub-pixels are red 51, blue 52 and green 53, and may comprise, as in FIG. 2(c), in addition a white sub-pixel 54 for increasing the brightness of the pixel 50. The arrangement in FIG. 2(a) is known by the abbreviation "RGB stripe", this is the most widespread. The arrangement in FIG. 2(b) is known by the abbreviation "RGB quad", and the arrangement in FIG. 2(c) by the abbreviation "RGBW quad".

The addressing principle that has just been described in relation to FIGS. 1 and 2 is one of the addressing principles that can be implemented in relation to the present invention. The color can be obtained by controlling the color emitted by the OLED layers forming the sub-pixels or by color filters that modify the white color of the light emitted by the sub-pixels, as will be explained below in relation to FIG. 3.

Figure 3A:
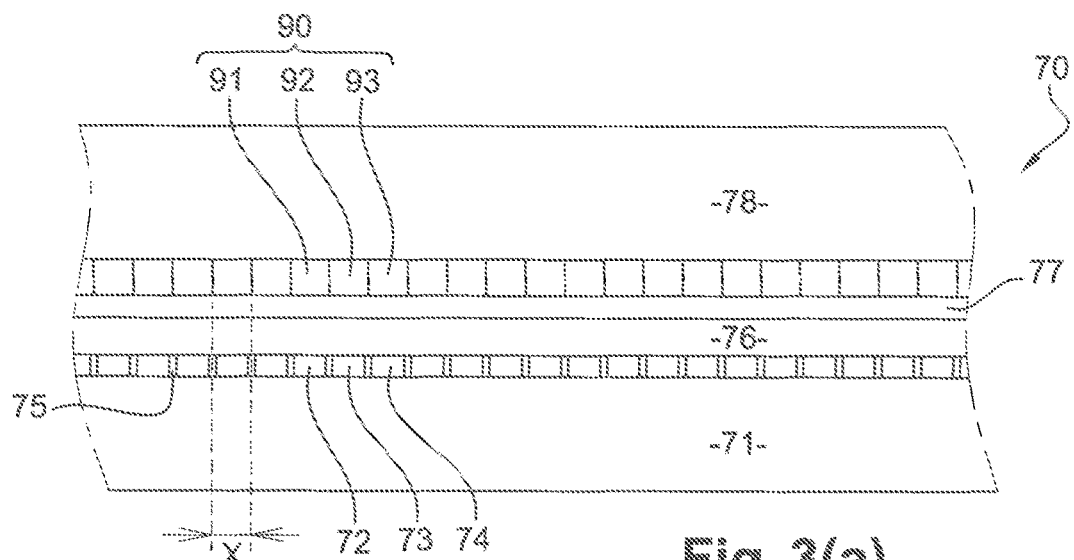

FIG. 3 shows schematically OLED microdisplays according to the prior art; it illustrates the problem that the present invention seeks to solve. FIG. 3(a) shows a global schematic view of the structure of the device 70: there can be seen the substrate 71 (of the CMOS or TFT type, the addressing circuits and components are not shown), the control electrodes 72, 73, 74 for the sub-pixels separated by a filler ("gap-fill") element 75, the OLED layer 76 able to emit a white light, the encapsulation layer 77, the colored filters blue 91, red and green 93 forming a pixel 90, and the wafer of glass 78 as a protective cover. The size of the sub-pixels is typically around 3.5 µm to 5 µm. It should be noted that, in this device according to the prior art, the OLED layer 76 extends over the entire surface of the device.

Figure 3B:
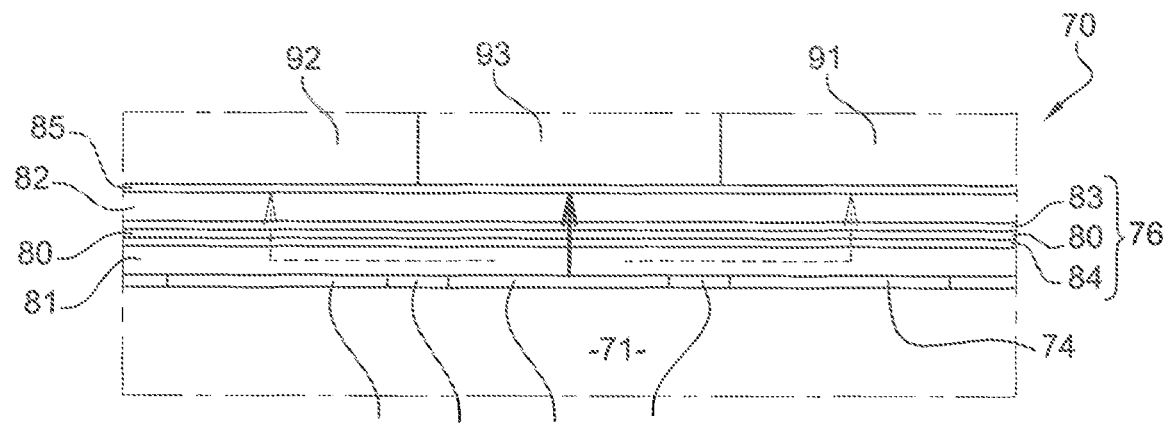

FIG. 3b shows an enlarged view of a device similar to the one shown in FIG. 3(a); this view is limited to a single pixel 90. The sub-pixels are defined firstly by the electrodes 72, 73, 74 that allow individual addressing thereof, and by the corresponding colored filters 91, 92, 93 that modify the light emitted by the OLED layer 76 with white emission that extends over the entire surface of the device. The space between two electrodes controlling adjacent sub-pixels 72, 73 can be filled by a filler element 75. Said OLED layer 76 comprises the light emitting layer 80 proper, which is sandwiched between two charge transport layers 81, 82. More precisely, in a typical device, the layer 81 comprises a hole injection and transport layer, and the layer 82 an electron injection and transport layer. However, it is also possible to use a so-called "inverse" stack, and in this case the layer 82 comprises a hole injection and transport layer, and the layer 81 an electron injection and transport layer. The layers 81 and 82 may comprise respectively a single layer that fulfils both the respective two charge injection and transport functions, or a plurality of layers, for example a layer for injection and another for transport of the respective charges. A common electrode 85 discharges the charges.

This device according to the prior art exhibits stray currents; this is illustrated in FIG. 3(b). This is because, if when a sub-pixel (for example 73) is switched on the main current passes directly (marked by a thick arrow) through the OLED layer in the shortest direction (i.e. vertical with respect to the substrate 71), some of this current propagates along other conduction tracks, insofar as these conduction tracks have a sufficiently low resistivity. Thus a stray current is observed which propagates in the charge transport layer 81, namely in the plane of the substrate, and which then passes through the OLED layer in the adjacent sub-pixel 72 or 73. This stray current is marked by dotted arrows. It leads to a stray light emission in the adjacent sub-pixels that modifies the image resolution of the display and reduces the fidelity of its color. The present invention seeks to provide a means for reducing this stray current.

Figure 3C:
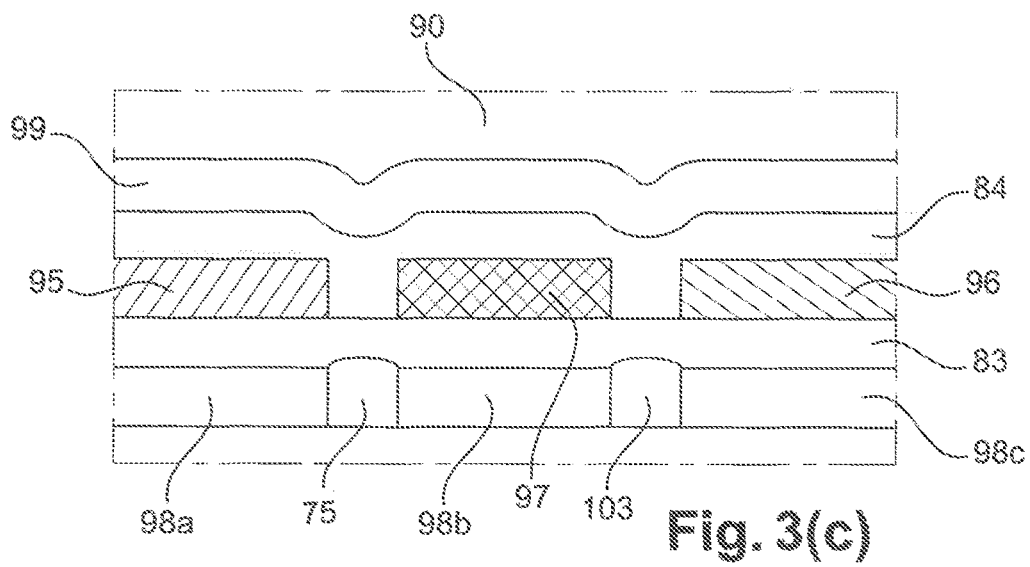

FIG. 3(c) shows another device of a known type wherein the color of a pixel 90 is not generated, as in the devices in FIGS. 3(a) and 3(b), by a white-emission OLED element provided with color filters for each of the three sub-pixels, but by three sub-pixels provided with electroluminescent layers 95, 96, 97 that directly emit in red, blue and green. In this embodiment, each sub-pixel 95, 96, 97 has its own addressing electrode 98a,b,c, but the first layer for injecting and transporting charges 83 (for example holes), and/or the second layer for injecting and transporting charges (for example electrons) 84 and the common electrode 99 are common in order to simplify manufacture of the device. The problem of the stray currents is the same as that described in relation to FIG. 3(b); the contribution of the hole injection and transport layer 83 is preponderant in these stray currents.

Figure 4:
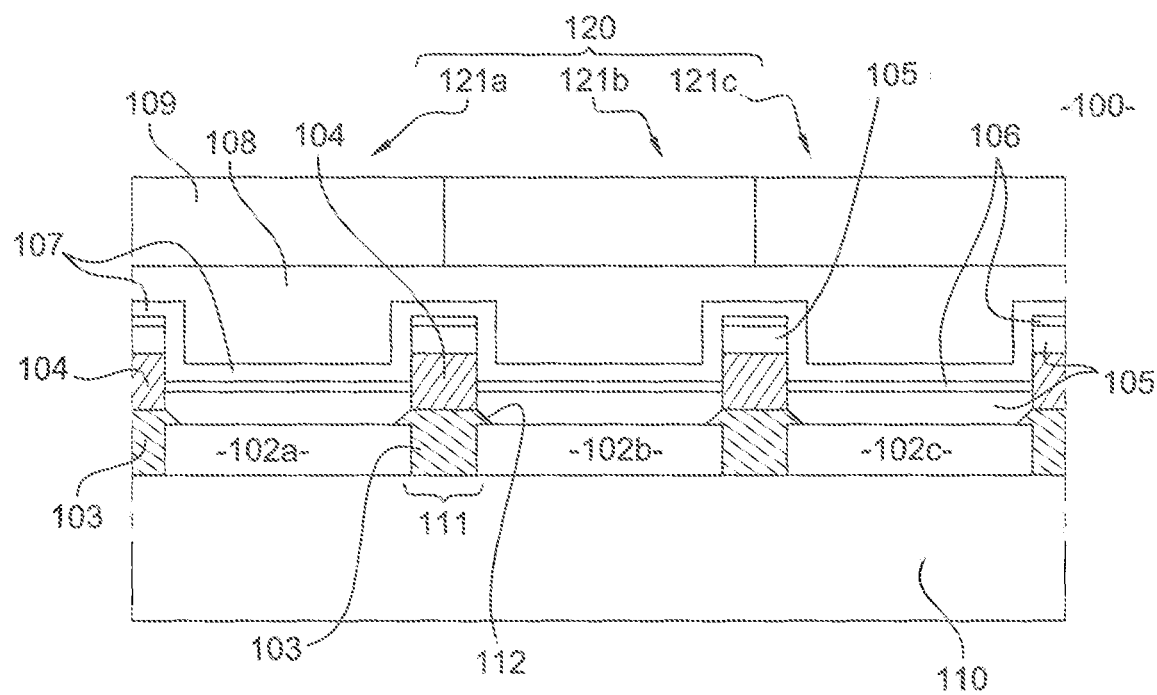
FIGS. 4 to 8 illustrate aspects and embodiments of the invention; they are not intended to limit the scope of the invention.

FIG. 4 illustrates a cross-section view of a device 100 according to a first embodiment of the invention. It comprises a substrate 110 on which three sub-pixels 121a, 121b, 121c defining a pixel 120 are deposited. In this example each sub-pixel represents a basic emitting zone.

The substrate 110 is specially adapted to the device 100, it may in particular be a substrate made from silicon, glass or plastics material for a flexible device. The substrate 110 may in particular be a CMOS silicon substrate of a known type that comprises the circuits addressing the pixels 120 and sub-pixels 121; these aspects of addressing the pixels and sub-pixels do not form part of the present invention.

The basic emitting zones (sub-pixels) are formed by a plurality of layers, which will be enumerated here commencing with the layer deposited directly on the substrate, which is an electrode 102, for each sub-pixel; these electrodes 102 of sub-pixels are designated here by the signs 102a, 102b, 102c. On top of the electrode there are deposited the OLED electroluminescent layers forming a stack 105, a top injection layer 106, which is optional, and then a common conformal electrode 107. According to the type of device, it is possible to add a planarization layer 108 and colored filters 109. More precisely, the planarization layer is particularly advantageous if colored filters are used, in order to avoid optical losses. Even in the absence of optical filters the planarization layer may form the basis for a supplementary encapsulation system, which may comprise for example an inorganic layer and/or a glass cover. The need to use color filters depends on the emission color of the OLED layers forming the sub-pixels, as explained above.

Two adjacent basic emitting-zone electrodes (sub-pixels) (for example the electrodes 102a and 102b), whether or not they belong to the same pixel, are separated by a space 111 here referred to as a natural space ("gap"). According to an essential characteristic of the invention, this natural space 111 is filled with a filler element with an insulating surface 103, referred to as "gap fill". Said filler element with insulating surface 103 may slightly overlap the sub-pixel electrode 102 in order to form a rim 112. In a particular embodiment not only the surface of the filler element 103 but the entire volume thereof is made from insulating material. It may be produced for example from a composition based on a photosensitive resin (also referred to as photoresist) or silica.

A separator 104 with insulating surface is disposed on top of the filler element 103 with insulating surface. The walls thereof may be vertical. It separates the stack of OLED layers 105 and the top injection layer 106 of two adjacent sub-pixels 102. In a particular embodiment not only its surface but the entire volume thereof is made from insulating material. It may be manufactured from a photosensitive resin; it is possible to use photosensitive resins of a negative type that make it possible to produce fairly stiff or even overhanging side walls. Inorganic dielectric materials may also be used.

The OLED stack 105 is typically deposited by thermal evaporation. This technique forms a deposition highly directively, and thus the OLED stack 105 is deposited fundamentally on the horizontal surfaces only and is not deposited on the vertical walls of the separators. The layers of the OLED stack 105 are therefore interrupted by the separator, in other words: they are non-continuous through the separator, they are pixelated.

The pixelated top injection layer 106 may be replaced by a pixelated top electrode (i.e. each basic emission zone has its own top injection layer or top electrode layer). This top electrode layer may be produced from a thin metal such as aluminum (Al), silver (Ag) or the like; this layer may be deposited also by thermal evaporation and, in this case, it will be deposited on the horizontal surfaces only. It will be noted that, in the figures, this top electrode layer, when it replaces said top injection layer, corresponds to the layer identified by the numerical reference 106.

In order to connect the top injection layer 106 or the top electrode, or the last layer of the OLED stack 105 in the case where no top injection layer and no pixelated electrode is deposited, of all the pixels, there is a need for a common additional electrode 107 that is therefore not cut by the separators 104. This common electrode 107 must be deposited by a technique allowing conformal deposition. It may be produced by the technique of atomic deposition of thin films (known by the abbreviation ALD, "atomic layer deposition") or by chemical vapor deposition (CVD) of a transparent conductive oxide (TCO). Among the TCOs that may be suitable mention is made of ZnO, possibly doped with aluminum (known by the abbreviation AZO (aluminum-doped zinc oxide)), $SnO_2$, and indium oxide doped with tin (known by the abbreviation ITO (indium tin oxide)); these TCOs are known to persons skilled in the art. At the periphery (not shown in the figure), this common electrode 107 is connected to an electrical potential suitable for switching on the OLED 105 when the corresponding pixel electrode 102 is addressed. If a top electrode 106 is deposited by evaporation of a metal, this electrode will be (more or less) pixelated by the separators 104 and, in this case, the common conformal electrode 107 will make the electrical connection between the small tiles of the top injection layer 106.

In this embodiment of the device 101 according to the invention, the lateral stray currents in the OLED 105 are completely blocked. Another advantage of this architecture is that the conformal common electrode 107, in particular deposited by ALD, is a dense impervious thin film that acts as an encapsulation and protects the OLED stack 105 from moisture and oxygen. If a fault occurs, for example through a pinhole in the encapsulation, and in particular a fault that causes a black spot, this fault cannot extend over a larger surface area, since the separator 104 and the common electrode 107 isolate each pixel (more or less) hermetically against diffusion for example of water. Thus, if said fault affects only a sub-pixel it will possibly not even be visible to the user of the device.

The embodiment in FIG. 4 keeps its advantage in the case where the wall of the separator 104 is not completely vertical and does not completely isolate the adjacent basic emitting zones: this all the same significantly increases the lateral resistance between two adjacent OLED stacks 105 and reduces the phenomenon of crosstalk.

We describe here more precisely the various layers that form a device according to this first embodiment; this description represents only an example and does not limit the scope of the invention.

In a known manner the substrate 110 with active matrix may be a CMOS (silicon) substrate, comprising transistors in CMOS technology, or a substrate of the glass or plastics material type comprising TFT transistors (typically made from a-Si, poly-Si, or metal or organic oxide).

The pixel electrode 102 is a layer of aluminum (Al) or any other metal, with a typical thickness of 20 nm to 1000 nm, preferably from 100 nm to 300 nm, optionally covered with a fine layer of TiN or $MoO_3$, or a transparent conductive oxide (abbreviated to TCO) or similar. The pixel electrode may be produced from TCO, in particular in the embodiment of a display that emits downwards through a transparent substrate, or in the embodiment of a transparent display that emits upwards and downwards.

The display sub-pixel has a dimension lying typically between 1 µm and 100 µm, preferably between 2 µm and 50 µm, and even more preferentially between 2 µm and 10 µm. The distance between the sub-pixels is around 0.1 µm to 10 µm, and preferably between 0.2 µm and 1.0 µm.

The filler element 103 (gap-fill) may be a photosensitive resin, an epoxy resin, an inorganic dielectric such as $SiO_2$, $Si_3N_4$ or $Al_2O_3$. The width of the overlap (rim 112) on the electrode is between 0 and 0.5 µm, preferably between 0.05 µm and 0.25 µm.

The separator 104 may be composed of a photosensitive resin, an epoxy, an inorganic dielectric such as $SiO_2$, $Si_3N_4$, $Al_2O_3$ etc. The width thereof is approximately equal to the distance between the pixels.

The OLED stack 105 may be a white OLED, with a single cell or with a tandem cell or with a multiple cell, with a thickness typically lying between 50 nm and 500 nm, and preferably between 80 nm and 250 nm. The OLED stack 105 may emit upwards or downwards, or emit on two faces. The deposition of layers of the OLED stack 105 is performed by a directive method such as for example thermal evaporation.

The top injection layer 106 (or where applicable the top electrode) is deposited in the space between two adjacent separators 104. If a top electrode is deposited, it may be produced from a reflective metal such as aluminum (Al) or silver (Ag), the thickness of which is typically from 25 nm to 100 nm for bottom emission, from 1 nm to 15 nm for top emission or the two sides. The deposition may be performed by a directive method such as for example thermal evaporation.

The common electrode 107, deposited on top of the top injection layer 106 or the top electrode (if one of the latter is present) or on top of the OLED stack 105 in the contrary case, is typically a transparent conductive oxide such as for example ZnO, AZO, ITO, $SnO_2$ or other. It is deposited by a highly conformal deposition method such as ALD, PECVD or other. The thickness thereof is typically between 20 nm and 300 nm.

The planarization layer (smoothing layer) 108 is typically an organic material (such as a photosensitive resin or an epoxy resin) deposited using a solution (by spin coating or spray coating or similar).

The color filter 109 is a color filter of the prior art, produced by colored resins for example. It may be made from a colored photosensitive resin, or from pattern-type interference filters, or similar.

Figure 5:
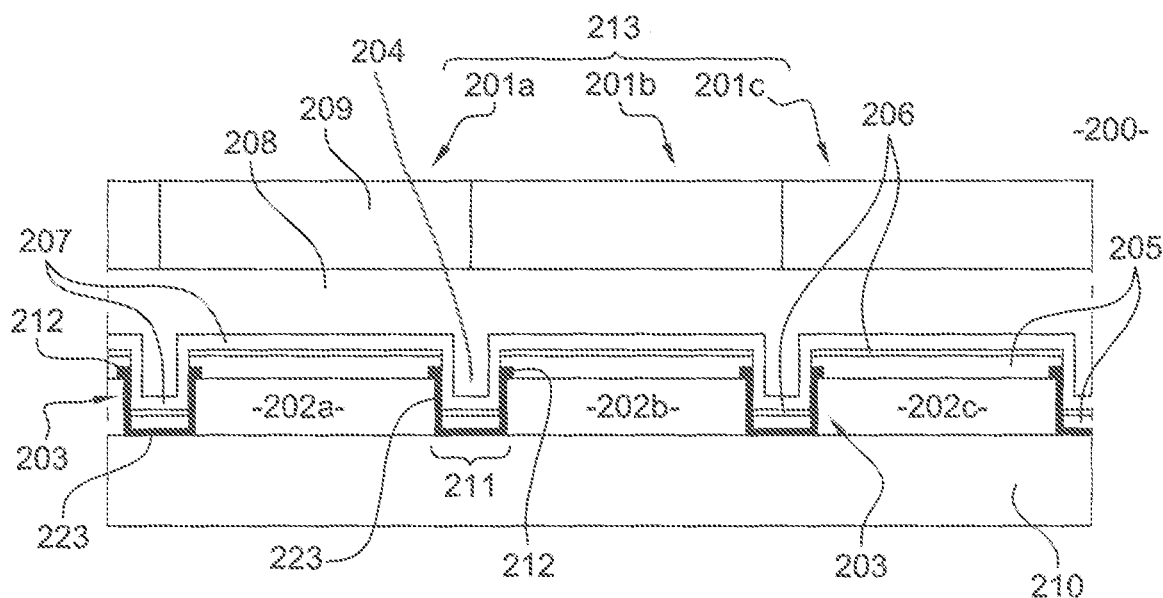

A second embodiment of the device according to the invention is illustrated in FIG. 5. The architecture repeats the majority of the components presented in relation to the first embodiment; the figure shows three basic emitting zones 201a, 201b, 201c, which form a pixel 213. The device 200, presented by a view in cross section, comprises a substrate 210 and electrodes 202 of sub-pixels separated by a natural space 211, which is in the form of a trench. An insulation layer 223 is disposed in this natural space 211, and more precisely on the walls thereof, with a rim 212 (overlap) on the electrode pixels 202. It fulfills the role of filler element with insulating surface 203.

The OLED electroluminescent layers 205 forming a stack are deposited on the sub-pixel electrode 202 and on said insulation layer 223, and then a top injection layer 206 or a top electrode (the first is preferred, but both are optional), a conformal electrode 207, a planarization layer (also referred to as a smoothing layer) 208 that is optional and fulfils the role of separator 204, and colored filters 209. In the absence of a smoothing layer 208, the natural space can remain empty above the common electrode 207, this void fulfilling the role of separator 204, or it may be filled by elements of the encapsulation system.

This embodiment makes it possible to use the natural space between the sub-pixel electrodes 202, which have vertical walls, as a separator. As the walls of the sub-pixel electrodes 202 are conductive, they must be covered with an insulation layer 223; the latter may also slightly cover the edge of the electrode pixel 202, which reduces the risk of short-circuits, but increases the complexity of the manufacturing method. Said insulation layer 223 may be a dielectric thin film, for example a layer of alumina, silica or similar, deposited by a conformal deposition method such as ALD, PECVD, or similar. It is possible to use an organic layer, for example a fine layer of photosensitive resin; it may typically be produced by photolithography, leaving a slight return (overlap) as indicated in FIG. 4 in order to avoid short-circuits on the edge.

We describe here more precisely the various layers that form a device according to this second embodiment; this description represents merely an example and does not limit the scope of the invention.

The substrate 200, the pixel electrode 202, the OLED stack 205, the optional common electrode 220, the conformal electrode 207, the optional planarization layer 208 and the color filter 209 repeat the compositions of the first embodiment.

A fine layer (not shown in the figure) of a conductive material capable of injecting charge carriers (electrons or holes, according to the geometry of the OLED device) in an organic layer for OLED is deposited on top of the pixel electrode 202. This fine layer protects the surface of the pixel when the insulating layer 223 is etched. The thickness thereof is between 1 nm and 50 nm, and preferably between 5 nm and 15 nm. Said fine layer may be made from TiN, or, and preferably, a conductive transparent oxide (in particular: tin oxide ($SnO_2$), indium oxide doped with tin (ITO), zinc oxide (ZnO), or zinc oxide doped with aluminum (AZO)). If said etching of the insulating layer 223 involves an oxygen plasma, it is preferred for said fine layer to be made from oxide.

To produce the insulating layer 223, a fine layer of $TiO_2$ (thickness typically between 5 nm and 20 nm) may be deposited by ALD over the entire surface of the substrate. Next a layer of photosensitive polymer of a known type is deposited (for example TEKR-003PM) by spin coating; the thickness may be between 0.5 µm and 1 µm for the reference indicated. Next the active surface of the pixels is delimited by photolithography; with a small overlap (typically between 0.1 µm and 0.2 µm) at the boundary of the pixels. Next the $TiO_2$ is removed by wet etching using HF; this does not attack the layer of TiN, which thus protects the pixel electrode. This choice of material ($TiO_2$ on TiN) is an essential means for successfully implementing this embodiment of the invention. Next the layer of photosensitive polymer is removed in order to open up the space in between pixels. The remaining part of the $TiO_2$ layer thus forms the insulating layer 223.

In another embodiment, it is possible advantageously to use, for the insulating layer 223, another insulating material such as aluminum oxide, silicon oxide or silicon nitride, deposited in a conformal way by ALD or by CVD. Instead of wet etching of this layer, it is possible to use dry etching techniques and in particular reactive dry etching (RIE).

Next, the organic layers are deposited in order to form the OLED diode, as well as the cathode. In this way the structure indicated is obtained, in which the pixels are separated by a trench, and the walls of this trench are insulated by the insulating layer 223. Said trench may optionally extend in the substrate 210, in particular if production thereof involves an etching step.

Other than in $TiO_2$, the insulation layer 223 may be a dielectric thin layer formed from another material, for example $Al_2O_3$, $SiO_2$, $Si_3N_4$ or similar, deposited by ALD, PECVD or similar. The thickness of the layer is typically around 5 nm to 25 nm, modeled by photolithography.

The top electrode, which is optional, may be produced in the form of a very fine layer of silver or aluminum with a thickness of between 4 nm and 10 nm. If it is absent, it is the common electrode 207 that then fulfils the function of electrode for each basic emitting zone. In this case, between two adjacent separators, and delimited by the latter, there advantageously extends a layer 206 for injecting charge carriers made from a material capable of injecting charge carriers into the OLED stack; it is possible to use molybdenum oxide or tungsten oxide. The layer may have a thickness typically of between 0.5 nm and 5 nm.

The present invention applies indifferently to the case where the basic emitting zones are pixels or sub-pixels and to the case where they emit a white or color light; the presence of colored filters 109 is necessary to allow the display of sub-pixels in color if the OLED layers of said sub-pixels all emit white light.

Figure 7:
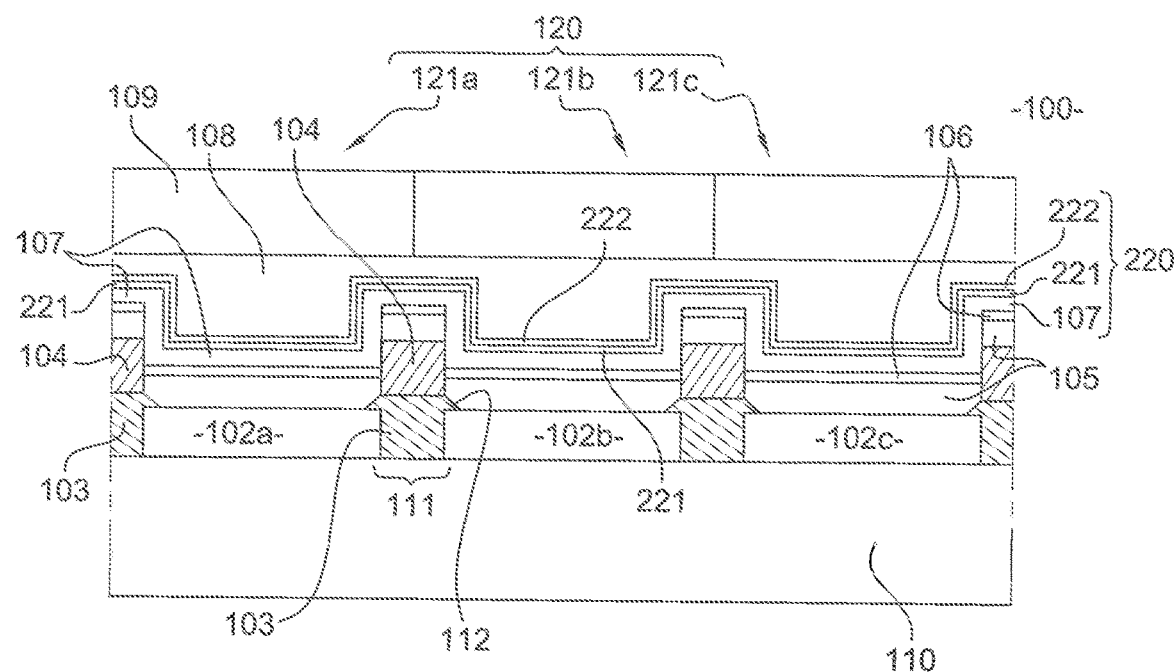
Figure 8:
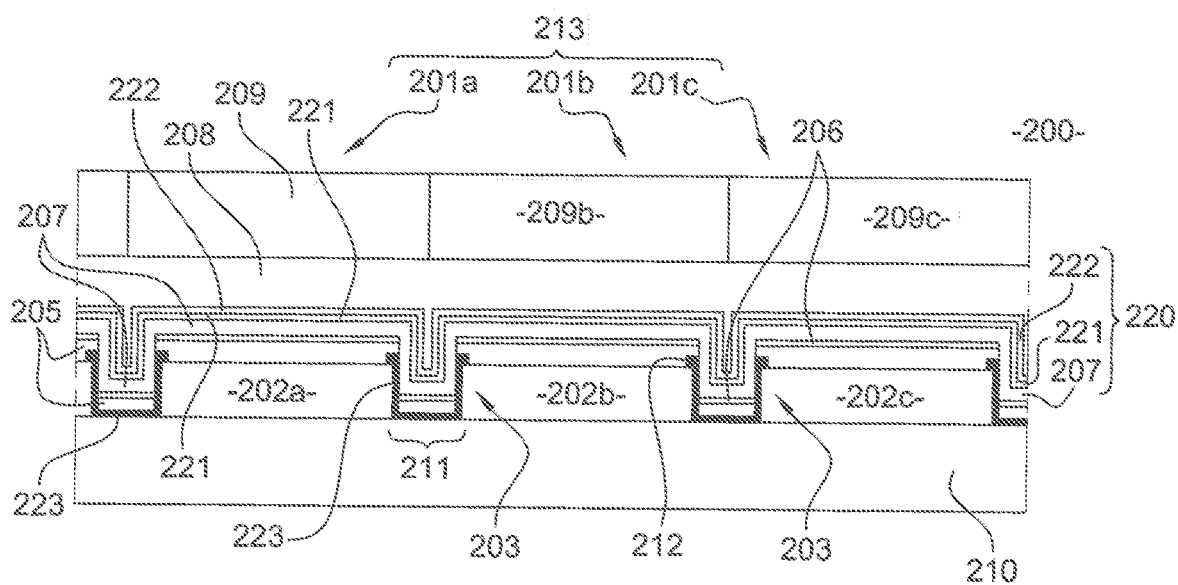

It should be noted that, for reasons of simplification, neither FIG. 4 nor FIG. 5 show the encapsulation system of the device. The encapsulation system may, as is known from the document U.S. Pat. No. 8,693,396 or 9,082,999, comprise a three-layer alumina/polymer/alumina complex. The smoothing layer 108 may be deposited on top of the last three-layer system layer. The present invention, in a variant, makes it possible to simplify this encapsulation system by using the common conformal electrode 107 as the first three-layer complex layer. This variant is shown in FIG. 7 (a variant of the device in FIG. 4) and in FIG. 8 (a variant of FIG. 5), where the references 220, 221 and 222 designate respectively the encapsulation system, the polymer layer and the oxide layer, the latter being able in particular to be silica or alumina. The smoothing layer 108 is then situated on top of the last encapsulation layer, in this case the layer of oxide 222. It should be noted that the common conformal electrode 107 acts as a barrier for the ambient atmosphere and protects the underlying layers. It may by itself represent the encapsulation system (knowing that the smoothing layer and optionally the colored filter act as mechanical protection), even if this is not the preferred embodiment.

We describe here in relation to FIG. 6 a third embodiment of the invention, with a structure of the OLED device of the tandem type. FIG. 6(a) shows such a device 130, which is characterized by the superimposition of two OLED stacks 131, 133 that are separated by a charge generation layer 132. For the structure of the filler element with insulating surface 103 and the separator with insulating surface 104, the device follows the first embodiment described above. In this figure, the smoothing layer and the color filters do not appear, being optional, according to the color emitted by the basic emitting zones forming the pixels, nor the encapsulation layer.

Figure 6A:
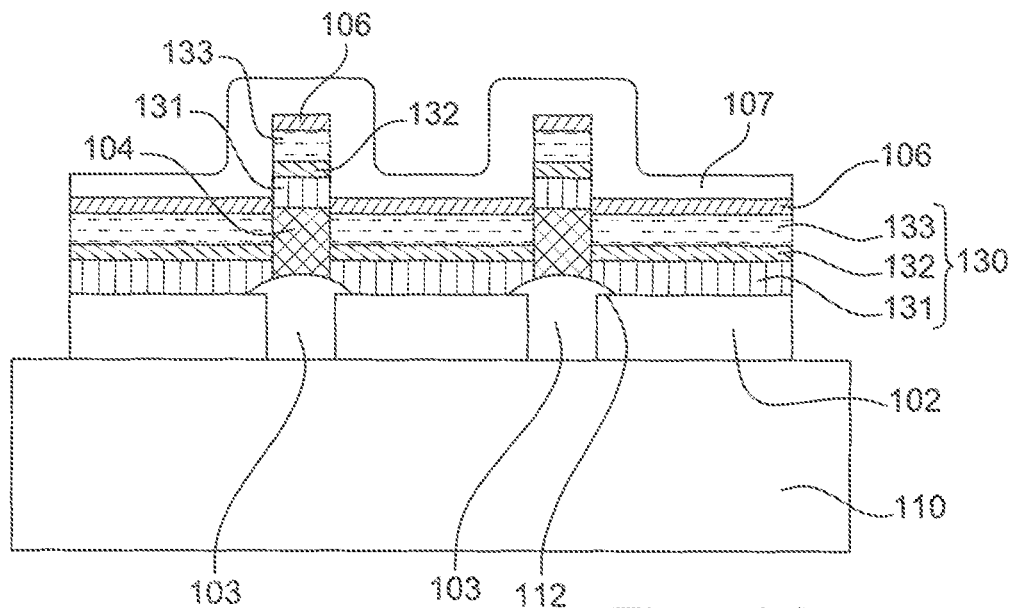
Figure 6B:
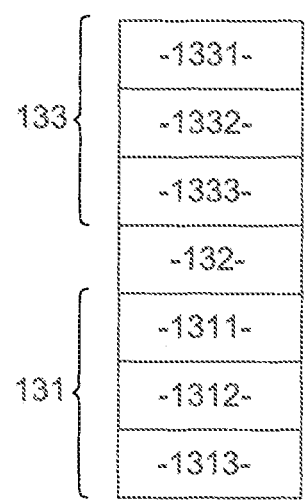

FIG. 6(b) shows in greater detail the stack of layers forming the OLED stack. The first 131 and the second 133 OLED stack each comprise its electron injection and transport layer 1311, 1331, which injects electrons into the electroluminescent layer 1312, 1332, and its hole injection and transport layer 1313, 1333, which injects holes into said electroluminescent layer 1312, 1332. The electron injection and transport layer 1311 of the first OLED stack 131 and the hole injection and transport layer 1333 of the second OLED stack 133 are separated by a charge generation layer 132. In a variant (not illustrated in the figures) the order of the layers may be reversed, and thus the electron injection and transport layer may be situated underneath the respective electroluminescent layer and the hole injection and transport layers on top of the respective electroluminescent layer.

Figure 6C:
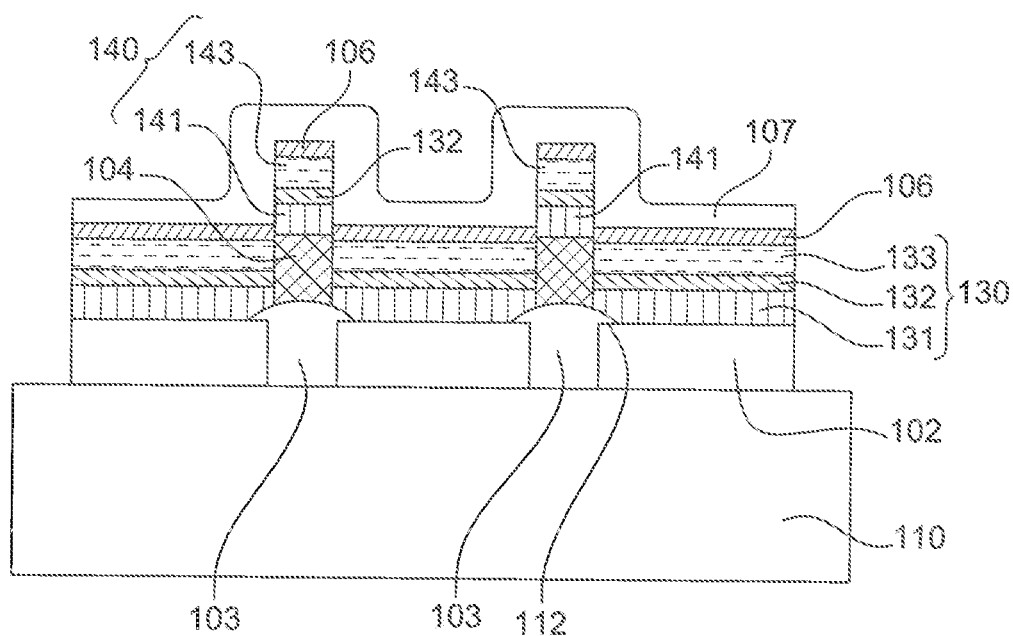
Figure 6D:
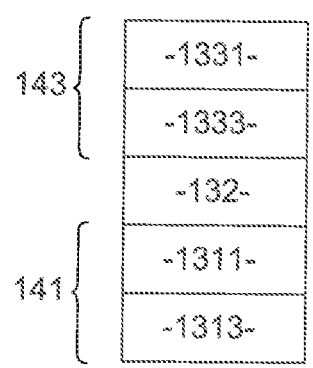

In an advantageous variant illustrated in FIG. 6(c), the electroluminescent layer 1312, 1332 (shown in FIG. 6(b) only) is structured, that is to say it is deposited solely on the basic emitting zones to the exclusion of the zones occupied by the filler elements with insulating surface and to the exclusion of the separator. Such a structured deposition can be obtained by means of a stencil; this is a technique known per se. In this variant, only the hole injection and transport layer 1313, 1333 and/or the electron injection and transport layer 1311, 1331 are deposited on the entire surface of the display, including on the zone occupied by the filler elements with insulating surface and the separator. In this zone a stack 141, 143 is obtained that is shown schematically in FIG. 6(d): this is not an "OLED stack" since it does not comprise the electroluminescent layer and therefore does not emit light. However, without the presence of the separator element with insulating surface, a stray current would pass through these injection and transport layers, which would contribute to the phenomenon of crosstalk that the present invention aims to eliminate. It would in principle be possible also to deposit the hole injection and transport layer 1313, 1333 and the electron injection and transport layer 1311, 1331 using the stencil technique, but this would increase the process time, would risk reducing industrial efficiency, and would thus give rise to unacceptable additional cost.

Examples

The invention is illustrated below by examples that however do not limit the scope thereof. These examples relate to embodiments and to the materials commonly used for producing the corresponding structures of the various embodiments.

Figure 2C:
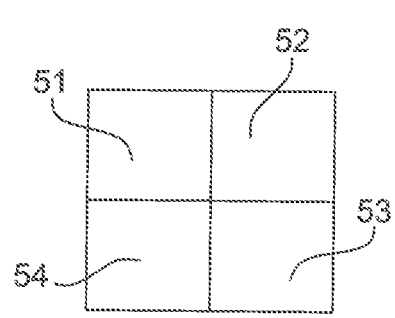

OLED microdisplays having a matrix of 1280×1024 pixels are produced, with four sub-pixels per pixel, in an arrangement of the "RGBW quad" type in accordance with FIG. 2(c). The size of the pixels was 9.4 μm×9.4 μm, the size of the sub-pixels 4.7 μm×4.7 μm. White pixels were used, colored by color filters. The total size of the display screen of the microdisplay was 12.03 mm×9.63 mm.

The circuits for the matrix of pixels including 2560×2048 sub-pixels were deposited on a silicon substrate 110 with a diameter of 200 mm with active matrix (CMOS technology). The electrode layer 102 of pixels was made from aluminum, with a size of 3.7 μm×3.7 μm. A layer of silicon oxide was deposited and structured by photolithography in order to generate the gap-fill. (It is also possible to deposit a photoresist varnish or a crosslinkable polymer, which is then structured). Above the gap-fill an organic separator is then deposited (by depositing and structuring a negative photoresist or another type of crosslinkable varnish). Alternatively it is possible to manufacture the separator by the deposition and structuring of an inorganic material (such as $Al_2O_3$ or $SiO_2$) using anisotropic etching.

A stack of OLED layers (white light) is deposited on this assembly by thermal evaporation through masks (in order to limit the deposition at the surface of the individual pixels), with the following particularities:

- Instead of a standard cathode, of the semi-transparent metal type, an electron injection layer 106 of molybdenum oxide with a thickness of between 0.3 and 5 nm is deposited by thermal evaporation.
- On top of the layer of $MoO_3$, a layer of TCO (such as AZO, ZnO or $SnO_2$) is deposited by ALD; this deposit covers the electrical connections of the cathode mentioned above. The thickness is between 25 nm and 300 nm.

It is possible to add an encapsulation of thin layers above the TCO layer, but the latter may also fulfill alone the function of an encapsulation layer. Above this assembly (preferably on a smoothing layer deposited on top of the encapsulation system) the colored filters and optionally a glass cover or other means for protecting the screen of the microdisplay are deposited. Next, the silicon wafer is cut in order to release the microdisplays, which can be integrated in more complex electronic devices.

Summary of the Objects According to the Invention

According to a first object the invention relates to an electroluminescent display device 100, 200 comprising a plurality of pixels 120, 213 deposited on a substrate 110, 210, each pixel being formed by one or more basic emitting zones 121a,b,c; 201a,b,c, each basic emitting zone including a base electrode 102a,b,c; 202a,b,c deposited on said substrate 110, 210 and an OLED stack 105, 205 deposited by a directive deposition technique, such as thermal evaporation, said OLED stack comprising an electroluminescent layer deposited on said base electrode 102a,b,c; 202a,b,c, by a directive non-conformal deposition technique such as thermal evaporation, and said device 100 comprising a common electrode 107, 207 deposited on top of said OLED stack by a conformal deposition technique such as ALD (atomic layer deposition) or CVD (chemical vapor deposition), said device being characterized in that:

- two adjacent base electrodes 102a, 102b; 202a, 202b belonging to two adjacent basic emitting zones 121a,b; 201a, 201b are separated by a filler element with insulating surface 103, 203 that fills the zone 111, 211 between said adjacent base electrodes 102a, 102b; 202a, 202b and which insulates them electrically from each other;
- at least the surface of said filler element with insulating surface 103, 203 that is in contact with said base electrodes 102a, 102b; 202a, 202b is produced from an insulating material;
- a separator 104, 204 is situated above said filler element 103, 203 and separates the electroluminescent layers of the OLED stack 105, 205 of two adjacent basic emitting zones 121a,b; 201a,b;
- the layers of the OLED stack 105, 205 are interrupted by the separator 104, 204;
- the common electrode 107, 207 is continuous above the separator 104, 204.

Variant 1 of this First Embodiment

Device characterized in that, between two adjacent separators 104, and delimited by the latter, a conductive transparent layer 106 extends, capable of injecting charge carriers into the OLED stack, deposited between said OLED stack 105 and said common electrode 107, the thickness of said conductive transparent layer preferably being between 0.5 nm and 5 nm.

Variant 2 of this First Embodiment

Device (optionally according to variant 1), characterized in that said conductive transparent layer 106 was deposited by a directive deposition technique, such as thermal evaporation.

Variant 3 of this First Embodiment

Device (optionally according to either one of variants 1 or 2), characterized in that said conductive transparent layer 106 is preferably a molybdenum oxide or a tungsten oxide.

Variant 4 of this First Embodiment

Device (optionally according to any one of variants 1 to 3), characterized in that said filler element with insulating surface 103 and said separator 104 constitute a barrier element that extends upwards from the substrate 110.

Variant 5 of this First Embodiment

Device (optionally according to any one of variants 1 to 4), characterized in that any filler element with insulating surface 103 is produced from an insulating material.

Variant 6 of this First Embodiment

Device (optionally according to any one of variants 1 to 3), characterized in that said separator 204 fills a top part of the zone between said adjacent base electrodes 202a, 202b.

Variant 7 of this First Embodiment

Device according to variant 6, characterized in that said separator 204 comprises said common electrode 207.

Variant 9 of this First Embodiment

Device (optionally according to any one of variants 1 to 8), characterized in that it comprises an encapsulation system 220 deposited on top of the common electrode 207.

Variant 9 of this First Embodiment

Device according to variant 8, characterized in that said encapsulation system 220 comprises a polymer layer 221 and an inorganic layer, preferably an oxide 222.

Variant 10 of this First Embodiment

Device according to variant 9, characterized in that it comprises an inorganic layer, preferably an oxide, deposited between the common electrode 207 and the polymer layer 221.

Variant 11 of this First Embodiment

Device (optionally according to any one of variants 1 to 10), characterized in that it comprises a smoothing layer 108, 208 deposited either on top of said common electrode 107, 207, or on top of said encapsulation system 220.

Variant 12 of this First Embodiment

Device (optionally according to any one of variants 1 to 11), characterized in that it comprises a system of colored filters 109, 209, deposited on the common electrode 107, 207, or preferably on the encapsulation system 220, or more preferentially on said smoothing layer 108, 208.

Variant 13 of this First Embodiment

Device (optionally according to any one of variants 1 to 12), characterized in that it comprises two superimposed OLED stacks 131, 133.

Variant 14 of this First Embodiment

Device according to variant 13, characterized in that the two OLED stacks 131, 133 are separated by a charge generation layer 132.

Variant 15 of this First Embodiment

Device (optionally according to any one of variants 1 to 14), characterized in that said filler element 103, 203 projects with its insulating material over part of the surface of said base electrodes 102*a*, 102*b*; 202*a*, 202*b*.

According to a second embodiment, the invention relates to an electroluminescent display device 200 comprising a plurality of pixels 213 deposited on a substrate 210, each pixel being formed by one or more basic emitting zones 201*a,b,c*, each basic emitting zone including a base electrode 202*a,b,c* deposited on said substrate 210 and an OLED stack 205 comprising an electroluminescent layer deposited on said base electrode 202*a,b,c*, by a directive non-conformal deposition technique such as thermal evaporation, and said device 200 comprising a common electrode 207 deposited on top of said OLED stack by a conformal deposition technique such as ALD (atomic layer deposition) or CVD (chemical vapor deposition), said device being characterized in that:
- two adjacent base electrodes 202*a*, 202*b* belonging to two adjacent basic emitting zones 201*a*, 201*b* are separated by a filler element with insulating surface 203 that fills the zone 211 between said adjacent base electrodes 202*a*, 202*b* and insulates them electrically from each other;
- at least the surface of said filler element with insulating surface 203 that is in contact with said base electrodes 202*a*, 202*b* is produced from an insulating material;
- a separator 204 is situated on top of said filler element 203 and separates the electroluminescent layers of the OLED stack 205 of two adjacent basic emitting zones 201*a*, 201*b*;
- said separator 204 fills a top part of the zone between said adjacent base electrodes 202*a*, 202*b*;
- the layers of the OLED stack 205 are non-continuous through the separator 204 (i.e. they are interrupted by the separator), whereas the common electrode 207 is continuous through the separator 204 (i.e. it is continuous above the separator).

Variant 1 of this Second Embodiment

Device according to the second embodiment, characterized in that said separator 204 comprises said common electrode 207.

Variant 2 of this Second Embodiment

Device (optionally according to variant 1), characterized in that it comprises an encapsulation system 220 deposited on top of the common electrode 207.

Variant 3 of this Second Embodiment

Device according to variant 2, characterized in that said encapsulation system 220 comprises a layer of polymer 221 and an inorganic layer, preferably an oxide 222.

Variant 4 of this Second Embodiment

Device according to variant 3, characterized in that it comprises an inorganic layer, preferably an oxide, deposited between the common electrode 207 and the layer of polymer 221.

Variant 5 of this Second Embodiment

Device (optionally according to any one of variants 1 to 4), characterized in that it comprises a smoothing layer 108, 208 deposited either on top of said common electrode 107, 207 or on top of said encapsulation system 220.

Variant 6 of this Second Embodiment

Device (optionally according to any one of variants 1 to 5), characterized in that it comprises a system of colored filters 209, deposited on the common electrode 207, or preferably on the encapsulation system 220, or even more preferentially on said smoothing layer 208.

Variant 7 of this Second Embodiment

Device (optionally according to any one of variants 1 to 6), characterized in that it comprises two superimposed OLED stacks, these two OLED stacks possibly being separated by a charge generation layer.

Variant 8 of this Second Embodiment

Device (optionally according to any one of variants 1 to 7), characterized in that said filler element 203 projects with its insulating material over part of the surface of said base electrodes 202*a*, 202*b*.

Variant 9 of this Second Embodiment

Device (optionally according to any one of variants 1 to 8), characterized in that, between two adjacent separators 204, and delimited by the latter, a conductive transparent layer extends, capable of injecting charge carriers into the OLED stack, deposited between said OLED stack 205 and said common electrode 207, the thickness of said conductive transparent layer preferably being between 0.5 nm and 5 nm.

Variant 10 of this Second Embodiment

Device according to variant 9, characterized in that said conductive transparent layer has been deposited by a directive deposition technique, such as thermal evaporation.

Variant 11 of this Second Embodiment

Device according to variant 9 or 10, characterized in that said conductive transparent layer is preferably a molybdenum oxide or a tungsten oxide.

Variant 12 of this Second Embodiment

Device (optionally according to any one of variants 1 to 8), characterized in that, between two adjacent separators 204, and delimited by the latter, a top electrode extends, which is optional, and can be produced in the form of a very fine layer of silver or aluminum with a thickness of between 4 nm and 10 nm and deposited by a directive deposition technique, such as thermal evaporation.

If it is absent, it is the common electrode 207 that then fulfills the function of electrode for each basic emitting zone.

Variant 13 of this Second Embodiment

Device according to variant 12, characterized in that said top electrode is produced from a thin metal such as aluminum (Al), silver (Ag) or other; this layer may also be deposited by thermal evaporation and in this case it will be deposited on the horizontal surfaces only.

What is claimed is:

1. Electroluminescent display device (200) comprising a plurality of pixels (213) deposited on a substrate (210), each pixel being formed by one or more basic emitting zones (201a,b,c), two adjacent basic emitting zones being separated by a space (211) having vertical walls, each basic emitting zone including a base electrode (202a,b,c) deposited directly on said substrate (210), and each basic emitting zone further including an OLED stack (205) comprising an electroluminescent layer deposited on said base electrode (202a,b,c), and said device (200) comprising a common electrode (207) deposited on top of said OLED stack, said device being characterized in that:

two adjacent base electrodes (202a, 202b) belonging to two adjacent basic emitting zones (201a, 201b) are separated by a filler element (203) with insulating surface (223), disposed in the space (211) between said basic emitting zones (201), said insulating surface (223) coverings the surface of the base electrodes in the space (211) between said adjacent base electrodes (202a, 202b) and which insulates them electrically from each other;

at least the surface (223) of said filler element (203) with insulating surface (223) that is in contact with said base electrodes (202a, 202b) is produced from an insulating material.

2. Device according to claim 1, characterized in that said substrate (210) is an active matrix substrate comprising a silicon substrate of the CMOS type, or a substrate of the glass or plastics material type comprising TFT transistors.

3. Device according to claim 2, characterized in that said space (211) between said adjacent base electrodes (202a, 202b) is in the form of a trench.

4. Device according to claim 2, characterized in that, between two adjacent separators (204), and delimited by the latter, a conductive transparent layer extends, capable of injecting charge carriers into the OLED stack, deposited between said OLED stack (205) and said common electrode (207), the thickness of said conductive transparent layer preferably being between 0.5 nm and 5 nm.

5. Device according to claim 1, characterized in that a separator (204) is situated on top of said filler element (203) and separates the electroluminescent layers of the OLED stack (205) of two adjacent basic emitting zones (201a,b);

said separator (204) fills a top part of the zone between said adjacent base electrodes (202a, 202b);

the layers of the OLED stack (205) are interrupted by the separator (204);

said separator (204) comprises said common electrode (207).

6. Device according to claim 5, characterized in that said filler element (203) projects with its insulating material (223) over part of the surface of said base electrodes (202a, 202b).

7. Device according to claim 5, characterized in that, between two adjacent separators (204), and delimited by the latter, a conductive transparent layer extends, capable of injecting charge carriers into the OLED stack, deposited between said OLED stack (205) and said common electrode (207), the thickness of said conductive transparent layer preferably being between 0.5 nm and 5 nm.

8. Device according to claim 1, characterized in that said space (211) between said adjacent base electrodes (202a, 202b) is in the form of a trench.

9. Device according to claim 8, characterized in that said filler element (203) projects with its insulating material (223) over part of the surface of said base electrodes (202a, 202b).

10. Device according to claim 9, characterized in that said conductive transparent layer is preferably a molybdenum oxide or a tungsten oxide.

11. Device according to claim 10, characterized in that said top electrode layer is produced from a thin metal comprising aluminum (Al) or silver (Ag).

12. Device according to claim 11, characterized in that it comprises an encapsulation system (220) deposited on top of the common electrode (207).

13. Device according to claim 10, characterized in that, between two adjacent separators (204), and delimited by the latter, a top electrode extends, with a thickness of between 4 nm and 10 nm and deposited by a directive deposition technique comprising thermal evaporation.

14. Device according to claim 10, characterized in that it comprises an encapsulation system (220) deposited on top of the common electrode (207).

15. Device according to claim 8, characterized in that, between two adjacent separators (204), and delimited by the latter, a conductive transparent layer extends, capable of injecting charge carriers into the OLED stack, deposited between said OLED stack (205) and said common electrode (207), the thickness of said conductive transparent layer preferably being between 0.5 nm and 5 nm.

16. Device according to claim 1, characterized in that, between two adjacent separators (204), and delimited by the latter, a conductive transparent layer extends, capable of injecting charge carriers into the OLED stack, deposited between said OLED stack (205) and said common electrode (207), the thickness of said conductive transparent layer preferably being between 0.5 nm and 5 nm.

17. Device according to claim 16, characterized in that said conductive transparent layer was deposited by a directive deposition technique comprising thermal evaporation.

18. Device according to claim 17, characterized in that, between two adjacent separators (204), and delimited by the latter, a top electrode extends, with a thickness of between 4 nm and 10 nm and deposited by a directive deposition technique comprising thermal evaporation.

19. Device according to claim 18, characterized in that said top electrode layer is produced from a thin metal comprising aluminum (Al) or silver (Ag).

20. Device according to claim 18, characterized in that it comprises an encapsulation system (220) deposited on top of the common electrode (207).

21. Device according to claim 17, characterized in that it comprises an encapsulation system (220) deposited on top of the common electrode (207).

22. Device according to claim 21, characterized in that said encapsulation system (220) comprises a polymer layer (221) and an inorganic layer, preferably an oxide (222).

23. Device according to claim 22, characterized in that it comprises an inorganic layer, preferably an oxide, deposited between the common electrode (207) and the polymer layer (221).

24. Device according to claim 23, characterized in that it comprises a smoothing layer (108, 208) deposited either on top of said common electrode (107, 207) or on top of said encapsulation system (220).

25. Device according to claim 17, characterized in that said conductive transparent layer is preferably a molybdenum oxide or a tungsten oxide.

26. Device according to claim 1, characterized in that it comprises a smoothing layer (108, 208) deposited either on top of said common electrode (107, 207) or on top of said encapsulation system (220).

27. Device according to claim 26, characterized in that it comprises a system of colored filters (209), deposited on the common electrode (207), or preferably on the encapsulation system (220), or even more preferentially on said smoothing layer (208).

28. Device according to claim 26, characterized in that it comprises two superimposed OLED stacks.

29. Device according to claim 1, characterized in that it comprises a system of colored filters (209), deposited on the common electrode (207), or preferably on the encapsulation system (220), or even more preferentially on said smoothing layer (208).

30. Device according to claim 29, characterized in that it comprises two superimposed OLED stacks.

31. Device according to claim 29, characterized in that said common electrode (207) has been deposited by a conformal deposition technique comprising ALD (atomic layer deposition) or CVD (chemical vapor deposition).

32. Device according to claim 1, characterized in that it comprises two superimposed OLED stacks.

33. Device according to claim 32, characterized in that the two OLED stacks are separated by a charge generation layer.

34. Device according to claim 33, characterized in that said base electrode (202a,b,c) is covered on its top by a layer of transparent conductive material capable of injecting charge carriers in an organic layer for OLED.

35. Device according to claim 33, characterized in that said common electrode (207) has been deposited by a conformal deposition technique comprising ALD (atomic layer deposition) or CVD (chemical vapor deposition).

36. Device according to claim 32, characterized in that said base electrode (202a,b,c) is covered on its top by a layer of transparent conductive material capable of injecting charge carriers in an organic layer for OLED.

37. Device according to claim 32, characterized in that said common electrode (207) has been deposited by a conformal deposition technique comprising ALD (atomic layer deposition) or CVD (chemical vapor deposition).

38. Device according to claim 1, characterized in that said common electrode (207) has been deposited by a conformal deposition technique comprising ALD (atomic layer deposition) or CVD (chemical vapor deposition).

39. Device according to claim 38, characterized in that said base electrode (202a,b,c) is covered on its top by a layer of transparent conductive material capable of injecting charge carriers in an organic layer for OLED.

40. Device according to claim 1, characterized in that said base electrode (202a,b,c) is covered on its top by a layer of transparent conductive material capable of injecting charge carriers in an organic layer for OLED.

* * * * *